United States Patent
Kano et al.

[11] Patent Number: 6,111,802
[45] Date of Patent: Aug. 29, 2000

[54] SEMICONDUCTOR MEMORY DEVICE

[75] Inventors: Hideki Kano, Kanagawa; Masato Matsumiya, Kawasaki; Masato Takita, Kawasaki; Toru Koga, Kawasaki; Satoshi Eto, Kawasaki; Toshikazu Nakamura, Kawasaki; Mitsuhiro Higashiho, Kasugai; Kuninori Kawabata; Ayako Kitamoto, both of Kawasaki, all of Japan

[73] Assignee: Fujitsu Limited, Kawasaki, Japan

[21] Appl. No.: 09/070,840

[22] Filed: May 1, 1998

[30] Foreign Application Priority Data

May 19, 1997 [JP] Japan ................................ 9-127735

[51] Int. Cl.$^7$ ........................................ G11C 7/00
[52] U.S. Cl. .................... 365/203; 365/210; 365/230.06; 365/185.2
[58] Field of Search ........................ 340/173 R; 365/203, 365/230.06, 189.09, 189.04, 210, 196, 185.22, 185.2, 104, 102, 207, 205

[56] References Cited

U.S. PATENT DOCUMENTS

| | | | |
|---|---|---|---|
| 4,010,453 | 3/1977 | Lewis | 340/173 |
| 4,417,329 | 11/1983 | Mezawa et al. | 365/203 |
| 4,525,810 | 7/1985 | Cochran et al. | 365/102 |
| 4,598,387 | 7/1986 | Chuang et al. | 365/149 |
| 4,601,017 | 7/1986 | Mochizuki et al. | 365/189 |
| 4,622,655 | 11/1986 | Suzuki | 365/149 |
| 5,905,685 | 5/1999 | Nakamura et al. | 365/207 |

FOREIGN PATENT DOCUMENTS

| | | |
|---|---|---|
| 57-111880 | 7/1982 | Japan . |
| 6-84355 | 3/1994 | Japan . |
| 8-63964 | 3/1996 | Japan . |

Primary Examiner—David Nelms
Assistant Examiner—Thong Le
Attorney, Agent, or Firm—Arent Fox Kintner Plotkin & Kahn PLLC

[57] ABSTRACT

A semiconductor memory device includes a memory cell connected to a bit line and a word line, a bit line precharge circuit which precharges the bit line to a ground voltage, and a word decoder which sets the word line to a negative voltage when the word line is not selected.

17 Claims, 10 Drawing Sheets

I : 1/2 · Vii PRECHARE METHOD
II : VSS PRECHARE METHOD

SEMICONDUCTOR MEMORY DEVICE

BACKGROUND OF THE INVENTION

1. Field of the Invention

The present invention generally relates to semiconductor memory devices, and more particularly to a dynamic random access memory device which employs a so-called VSS precharge method in which a bit line connected to a memory cell is precharged to the ground voltage.

2. Description of the Related Art

Various bit line precharge methods applied to DRAM devices have been proposed. Examples of such methods are a Vii precharge method and ½•Vii precharge method. The Vii precharge method precharges the bit lines to an internal power supply voltage Vii. The ½•Vii precharge method precharges the bit lines to half the internal power supply voltage Vii. The ½•Vii precharge method consumes a smaller amount of power than the Vii precharge method, and is widely used as compared thereto.

FIG. 1 is a circuit diagram of a sense amplifier provided in a DRAM device. The sense amplifier includes pMOS (p-channel) transistors 1 and 2 serving as pull-up elements, and nMOS (n-channel) transistor 3 and 4 serving as pull-down elements. These transistors are connected in a cross-coupled formation. The sense amplifier is connected to a pair of bit lines BL and /BL, and is supplied with sense amplifier driving voltages PSA and NSA.

FIG. 2 is a waveform diagram of a sense amplifying operation in a DRAM device which has the sense amplifier shown in FIG. 1 and employs the ½•Vii precharge method. The sense amplifier driving voltages PSA and NSA are set equal to ½•Vii before data is read from a memory cell. Further, the bit lines BL and /BL are precharged to ½•Vii by a bit line precharge circuit (not shown).

If a memory cell connected to the bit line BL is selected and stores high-level data (that is, the selected memory cell stores a charge), the voltage of the bit line BL is changed to ½•Vii+ΔV where ΔV is a fine voltage produced so that the charge stored in the cell capacitor of the selected memory cell is divided into parts stored in the cell capacitor and the bit line BL.

Subsequently, the sense amplifier driving voltages PSA and NSA are set equal to Vii and VSS, respectively. Thus, the voltage of the bit line /BL is pulled down from the voltage ½•Vii and becomes equal to the ground voltage VSS due to the function of the nMOS transistor 4. The voltage of the bit line BL is pulled up from the ½•Vii+ΔV and becomes equal to the internal power supply voltage Vii.

If the internal power supply voltage Vii is attempted to be reduced in the case where the above-mentioned ½•Vii precharge method, the following disadvantage will occur. In this case, the gate-source voltage Vgs of the pMOS transistors 1 and 2 and the nMOS transistors 3 and 4 is reduced. Thus, it takes a longer time to amplify the fine voltage ΔV between the bit lines BL and /BL.

In contrast, the VSS precharge method in which the bit lines BL and /BL are precharged to the ground voltage VSS can speed up the operation of the sense amplifier.

FIG. 3 is a waveform diagram of an operation of the sense amplifier shown in FIG. 1 provided in the DRAM device employing the VSS precharge method. The sense amplifier driving voltage PSA is set equal to the ground voltage VSS before data is read from the memory cell. In addition, the bit lines BL and /BL are precharged to the ground voltage VSS.

When a memory cell connected to the bit line BL is selected and stores high-level data (that is, the selected memory cell stores a charge), the voltage of the bit line BL becomes equal to ΔV, and the voltage of the bit line /BL becomes equal to ΔVd generated by a dummy cell (<ΔV). Subsequently, the sense amplifier driving voltage PSA is set equal to Vii. Thus, the voltages of the bit lines BL and /BL are increased. Then, the sense amplifier driving voltage NSA becomes equal to VSS, and the MOS transistors 1, 2, 3 and 4 are turned ON, OFF, OFF and ON, respectively. As a result, the voltages of the bit lines BL and /BL become equal to Vii and VSS.

When the above-mentioned VSS precharge method is employed, the gate-source voltage Vgs of the pMOS transistors 1 and 2 can be increased, and thus it becomes possible to reduce the time necessary to amplify the fine voltage ΔV−ΔVd between the bit lines BL and /BL.

FIG. 4 is a circuit diagram of a memory cell of the DRAM device. The memory cell includes a cell capacitor 6 serving as a storage element, and a cell transistor 5 formed of an nMOS transistor for controlling a charge transfer. The gate (control electrode) of the cell transistor 5 is connected to a word line WL, and the source (a first current input/output electrode) thereof is connected to a bit line BL. The drain (a second current input/output electrode) of the cell transistor 5 is connected to one end of the cell capacitor 6, the other end of which is grounded.

When the VSS precharge method is employed and high-level data (logic "1") is written into the memory cell, the voltages of the word line WL and the bit line BL are respectively set equal to SVii and Vii, and the voltage of a storage node 7 is set equal to Vii. When low-level data (logic "0") is written into the memory cell, the voltages of the word line WL and the bit line BL are respectively set equal to SVii and VSS, and the voltage of the storage node 7 is set equal to VSS. The voltage SVii is a boosted voltage obtained by stepping up the internal power supply voltage Vii by means of a voltage boost circuit (not shown), and is greater than Vii+VTHn where VTHn is the threshold voltage of the nMOS transistor).

In the case where the VSS precharge method is employed, when the voltage of the bit line BL is set equal to VSS in a state in which the memory cell shown in FIG. 4 is not selected, the gate-source voltage Vgs of the cell transistor 5 becomes 0 V. Hence, if the high-level data is stored in the storage node 7, a leakage current i flows from the drain to source of the cell transistor 5 in accordance with a source-drain current ids vs. gate source voltage Vgs characteristic shown in FIG. 5.

Hence, the voltage drop of the storage node 7 is facilitated, and a refresh time tREF is degraded. In addition, the voltage appearing on the bit line BL is lower than a voltage ΔV which originally appears on the bit line BL when there is no leakage in the cell with the internal power supply voltage Vii applied thereto. Thus, the operational margin of the sense amplifier with respect to high-level data is reduced.

In the case where the ½•Vii precharge method is employed, when the potential of the storage node 7 is 0 V, the gate-source voltage Vgs is 0 V. Hence, the potential of the storage node 7 is increased due to the leakage current flowing in the cell transistor 5. However, in this case, the gate-drain voltage Vgs becomes negative, and the back bias is enhanced. As a result, the leakage current flowing in the cell transistor 5 can be suppressed.

SUMMARY OF THE INVENTION

An object of the present invention is to provide a semiconductor memory device employing the VSS bit line precharge method capable of reducing the leakage current which flows from the cell transistor in a case where high-level data is stored in a memory cell.

A more specific object of the present invention is to provide a semiconductor memory device having a sense amplifier having a first operational margin obtained when high-level data is read and output to a bit line and a second operational margin obtained when low-level data is read and output to the bit line, the first and second operational margins being almost the same as each other.

The above objects of the present invention are achieved by a semiconductor memory device comprising: a memory cell connected to a bit line and a word line; a bit line precharge circuit which precharges the bit line to a ground voltage; and a word decoder which sets the word line to a negative voltage when the word line is not selected. Since the word line is set to the negative voltage when not selected, a leakage current can be suppressed from flowing from the memory cell. In addition, there is no need to apply a boosted voltage to the word line when the word line is selected for the following reasons. First, the word line is set to the negative voltage, and thus the threshold voltage of the cell transistor can be reduced. Second, the bit line is precharged to the ground level. Third, the high-level voltage of the bit line can be reduced because the bit line is precharged to the ground level. The above reasons will be described in detail later.

The semiconductor memory device may be configured so that the word decoder comprises a transistor circuit which decodes an address signal and applies a given voltage equal to or lower than an internal power supply voltage to the word line when a decoded address indicates the word line so that no boosted voltage produced from the internal power supply voltage is applied to the word line when the word line is selected. Hence, there is no need to provide a voltage boost circuit which applies a boosted voltage to the word line, so that power consumption can be reduced.

The above objects of the present invention are also achieved by a semiconductor memory device comprising: a pair of first and second bit lines; a memory cell having a cell transistor and a cell capacitor, the cell transistor having a first current input/output electrode connected to the first bit line, a second input/output electrode connected to a first electrode of the cell capacitor having a second electrode grounded, and a control electrode connected to a word line; a bit line precharge circuit which precharges the first and second bit lines to a ground voltage; a reference voltage generating circuit which sets the second bit line to a reference voltage when data is read from the memory cell; a sense amplifier which amplifies a potential difference between the first and second bit lines when data is read from the memory cell; and a word decoder which sets the word line to a negative voltage when the word line is not selected. Since the word line is set to the negative voltage when not selected, a leakage current can be suppressed from flowing from the memory cell. In addition, there is no need to apply a boosted voltage to the word line when the word line is selected for the above-mentioned reasons.

The semiconductor memory device may be configured so that the reference voltage generating circuit generates, on the second bit line, a voltage lower than half a voltage appearing on the first bit line when high-level data is output to the first bit line from the memory cell in a case where no leakage current flows from the cell transistor. Hence, a margin of the sense amplifier with respect to high-level data output to the first bit line can be set approximately equal to a margin thereof with respect to low-level data output to the first bit line.

The semiconductor memory device may be configured so that: the reference voltage generating circuit comprises a dummy cell having a dummy cell transistor and a dummy cell capacitor; and the dummy cell transistor has a first current input/output electrode connected to the second bit line, a control electrode connected to a dummy word line, and a second input/output electrode connected to a first electrode of the dummy cell capacitor having a second electrode grounded. Hence, the dummy word line can be set to the negative voltage when not selected.

The semiconductor memory device may be configured so that the dummy cell capacitor has a capacitance equal to or less than half that of the cell capacitor, so that the dummy word line can be set to a negative voltage when the dummy word line is not selected. Hence, current consumed in a negative voltage generating circuit can be reduced.

The semiconductor memory device may be configured so that the dummy word line is set to the ground voltage when the dummy word line is not selected. Hence, current consumed in a negative voltage generating circuit can be reduced.

The semiconductor memory device may further comprise a dummy cell capacitor precharge circuit which precharges the first electrode of the dummy cell capacitor when the first and second bit lines are precharged. Hence, the reference voltage generated on the second bit line can be fixed.

The semiconductor memory device may be configured so that the reference voltage generating circuit comprises a capacitor having a first electrode connected to the second bit line and a second electrode connected to a dummy word line. Hence, the reference voltage generating circuit can be simply configured.

The semiconductor memory device may be configured so that the capacitor is a MOS capacitor.

The semiconductor memory device may be configured so that the dummy word line is set to a ground voltage when the dummy word line is not selected.

The semiconductor memory device may be configured so that the word decoder comprises a transistor circuit which decodes an address signal and applies a boosted voltage to the word line when a decoded address indicates the word line, the boosted voltage being produced from an internal power supply voltage and higher than the internal power supply voltage.

The semiconductor memory device may be configured so that the transistor circuit applies the negative voltage to the word line when the decoded address does not indicate the word line.

The semiconductor memory device may be configured so that the word decoder comprises a transistor circuit which decodes an address signal and applies a given voltage equal to or lower than an internal power supply voltage to the word line when a decoded address indicates the word line so that no boosted voltage produced from the internal power supply voltage is applied to the word line when the word line is selected. In this case, there is no need to provide a voltage boost circuit which applies a boosted voltage to the word line, so that power consumption can be reduced, as will be described in detal later.

The semiconductor memory device may be configured so that the transistor circuit applies the negative voltage to the word line when the decoded address does not indicate the word line.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

A description will now be given, with reference to FIGS. 6 and 7, of a first embodiment of the present invention.

Figure 6:
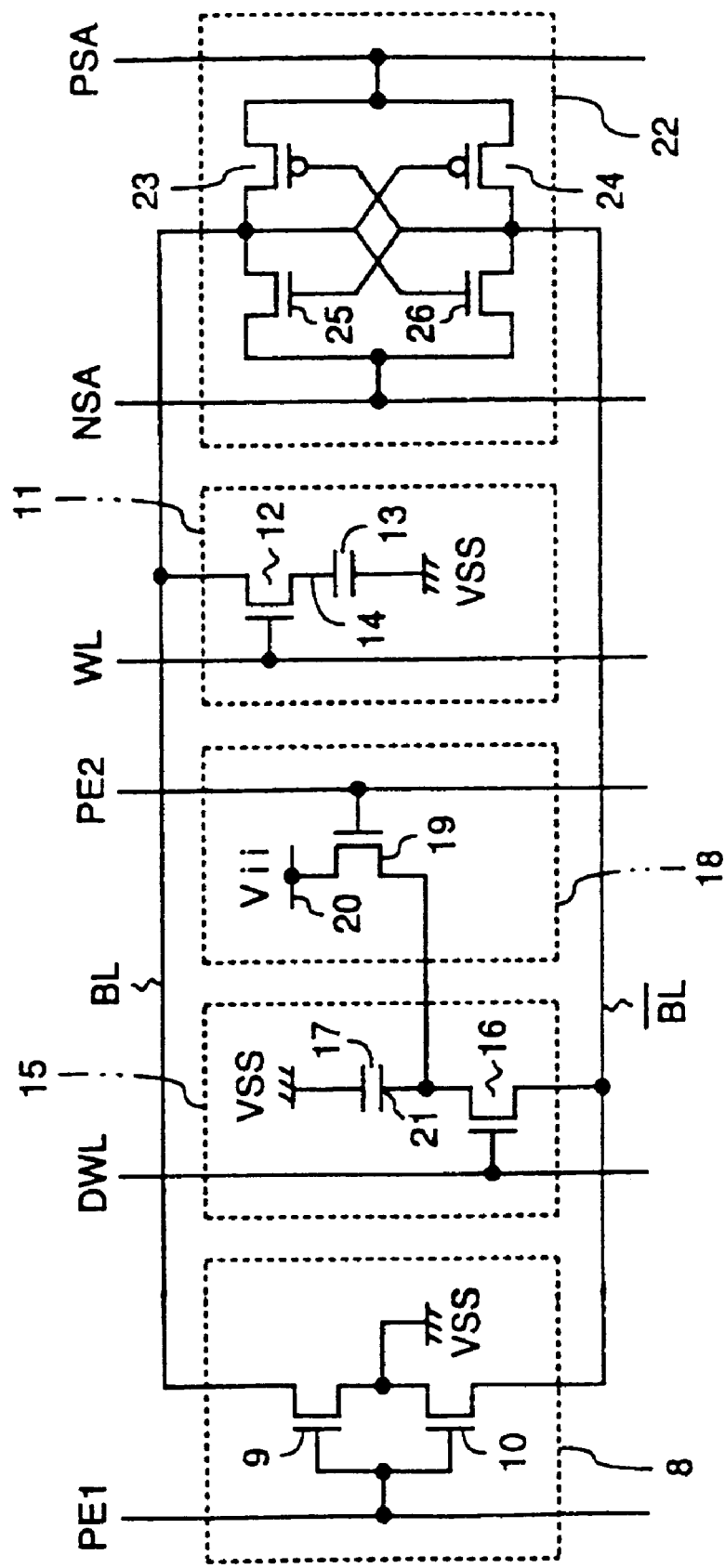
FIG. 6 is a circuit diagram of one column of a semiconductor memory device according to a first embodiment of the present invention.

FIG. 6 is a circuit diagram of one column of a semiconductor memory device according to the first embodiment of the present invention. The column shown in FIG. 6 has a bit line precharge circuit 8, which precharges the bit lines BL and /BL. The bit line precharge circuit 8 includes two nMOS transistors 9 and 10, which is turned ON and OFF by a control signal PE1. The nMOS transistor 9 has a drain connected to the bit line BL, a source grounded, and a gate supplied with the control signal PE1. The nMOS transistor 10 has a drain connected to the bit line Δ/BL, a source grounded, and a gate supplied with the control signal PE1.

At the time of precharging the bit lines BL and /BL, the control signal PE1 is set equal to Vii. Hence, the nMOS transistors 9 and 10 are respectively turned ON, and the voltages of the bit lines BL and Δ/BL become equal to VSS. In cases other than the bit line precharge, the control signal PE1 is set equal to VSS, and thus the nMOS transistors 9 and 10 are turned OFF.

The column shown in FIG. 6 has a memory cell 11, which is made up of a cell transistor 12 formed of an nMOS transistor for controlling a charge transfer, and a cell capacitor 13 serving as a storage element. The cell transistor 12 has a gate connected to the word line WL, and a source connected to the bit line BL. One end of the cell capacitor 13 is connected to the drain of the cell transistor 12, and the other end thereof is grounded. In practice, a plurality of memory cells are connected to the bit lines BL and Δ/BL. However, these memory cells are omitted from FIG. 6 for the sake of simplicity.

When high-level data is written into the memory cell 11, the voltages of the word line WL, bit line BL and a storage node 14 are respectively set equal to SVii, Vii and Vii. When low-level data is written into the memory cell 11, the voltages of the word line WL, bit line BL and the storage node 14 are respectively set equal to SVii, VSS and VSS.

The column shown in FIG. 6 includes a dummy cell 15, which serves as a reference voltage generating circuit and includes a dummy cell transistor 16 formed of an nMOS transistor for controlling a charge transfer, and a dummy cell capacitor 17. The dummy cell transistor 16 has a gate connected to a dummy word line DWL, and a source connected to the bit line /BL. One end of the dummy cell capacitor 17 is connected to the drain of the dummy cell transistor 16, and the other end thereof is grounded.

The dummy cell capacitor 17 is designed to have a capacitance value which is equal to or lower than half the capacitance value of the cell capacitor 13 while the sense amplifier 22 can perform the accurate sense operation and which makes it possible for the bit line /BL to have a voltage lower than half the voltage appearing on the bit line BL when high-level data is output to the bit line BL from the memory cell 11 in a case where no leakage current flows from the cell transistor 12. The voltage of the dummy word line DWL is set equal to SVii when the dummy word line DWL is selected, and a negative voltage VBB (for example, −0.4 V) when not selected.

The column shown in FIG. 6 includes a dummy cell capacitor precharge circuit 18, which includes an nMOS transistor 19 which is turned ON and OFF in accordance with a control signal PE2. The nMOS transistor 19 has a drain connected to a Vii power supply line 20 which carries the internal power supply voltage Vii, a source connected to a storage node 21 of the dummy cell 15, and the gate supplied with the control signal PE2. At the time of precharging the bit lines BL and /BL, the control signal PE2 is set equal to Vii+VTHn+α, so that the nMOS transistor 19 is turned ON and the voltage of the storage node 21 is set equal to Vii. In cases other than the bit line precharge, the control signal PE2 is switched to VSS, and the nMOS transistor 19 is thus turned OFF.

The column shown in FIG. 6 includes a sense amplifier 22, which includes pMOS transistors 23 and 24 serving as pull-up elements, and nMOS transistors 25 and 26 serving as pull-down elements. The pMOS transistor 23 has a drain connected to the bit line BL, a gate connected to the bit line /BL, and a source supplied with the sense amplifier driving voltage PSA. The pMOS transistor 24 has a drain connected to the bit line /BL, a gate connected to the bit line BL, and a source supplied with a sense amplifier driving voltage PSA. The nMOS transistor 25 has a drain connected to the bit line BL, a gate connected to the bit line /BL, and a source supplied with the sense amplifier driving voltage NSA. The nMOS transistor 26 has a drain connected to the bit line /BL, a gate connected to the bit line BL, and a source supplied with the sense amplifier driving voltage NSA.

Figure 7:
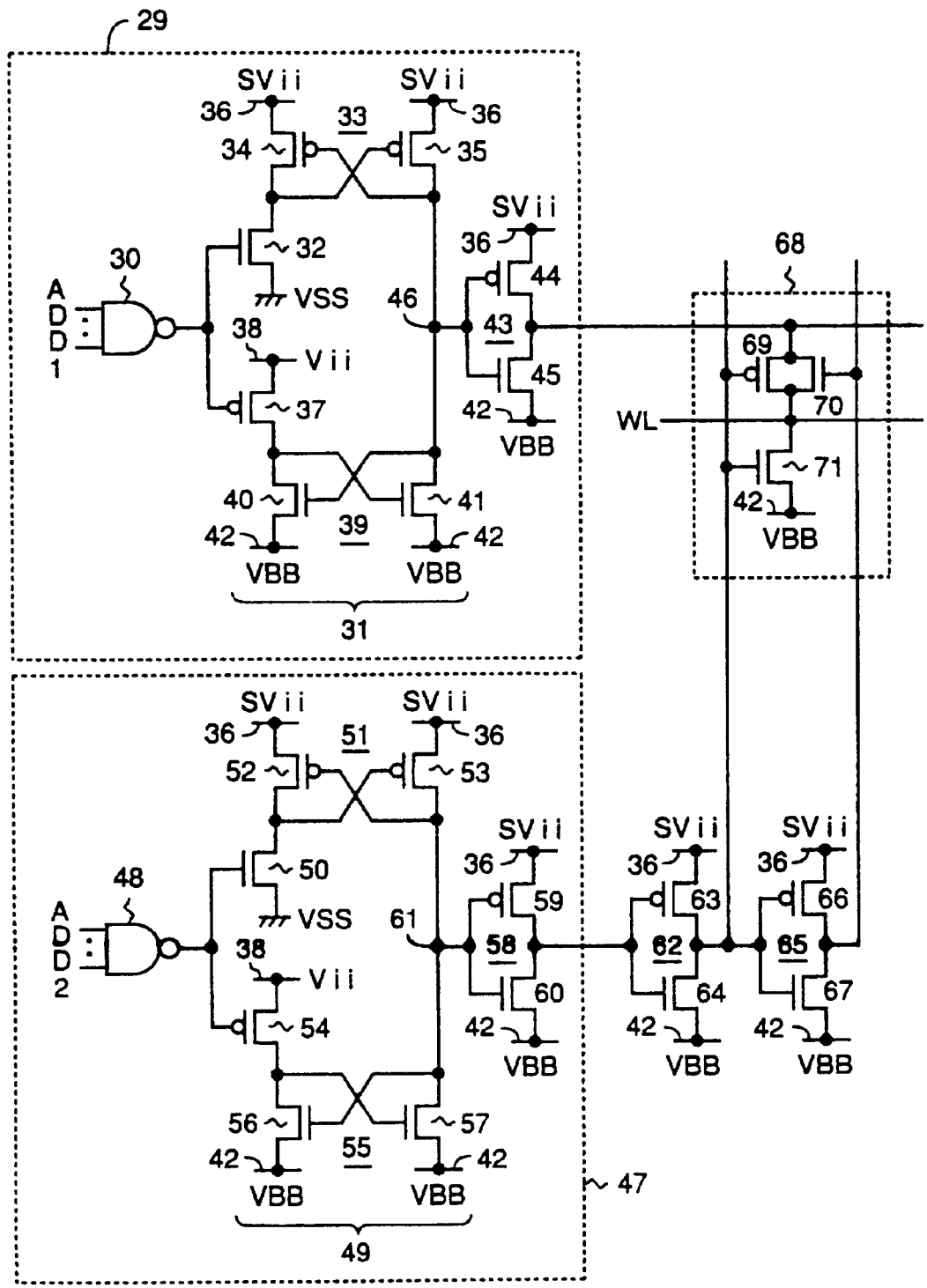
FIG. 7 is a circuit diagram of a word decoder of the semiconductor memory device according to the first embodiment of the present invention.

FIG. 7 is a circuit diagram of a part of a word decoder of the semiconductor memory device according to the first embodiment of the present invention. The word decoder shown in FIG. 7 includes a first word decoder 29 serving as a main word decoder. The main word decoder 29 is configured as follows. A NAND circuit 30 decodes an internal row address signal ADD1 for selecting the word line WL. A level converter circuit 31 converts the high-level output signal of the NAND circuit 30 into the boosted voltage SVii, and converts the low-level output signal thereof into the negative voltage VBB.

The level converter circuit 31 includes an nMOS transistor 32, which is turned ON and OFF in response to the output signal of the NAND circuit 30. The source of the nMOS transistor 32 is grounded, and the gate thereof is connected to the output terminal of the NAND circuit 30.

A pMOS flip-flop circuit 33 is made up of pMOS transistors 34 and 35 serving as pull-up elements. The pMOS transistor 34 has a source connected to an SVii power supply line 36, a gate connected to the drain of the pMOS transistor 35, and a drain connected to the drain of the nMOS transistor 32. The pMOS transistor 35 has a source connected to the SVii power supply line 36, and a gate connected to the drain of the pMOS transistor 34.

A pMOS transistor 37 is turned ON and OFF by the output signal of the NAND circuit 30. The source of the pMOS transistor 37 is connected to the Vii power supply line 38, and the gate thereof is connected to the output terminal of the NAND circuit 30.

An nMOS flip-flop circuit 39 is made up of nMOS transistors 40 and 41 serving as pull-down elements. The nMOS transistor 40 has a source connected to a VBB power supply line 42 which carries the negative voltage VBB, a gate connected to the drain of the nMOS transistor 41, and a drain connected to the drain of the pMOS transistor 37. The nMOS transistor 41 has a source connected to the VBB power supply line 42, a gate connected to the drain of the NMOS transistor 40, and a drain connected to the drain of the pMOS transistor 35.

The main word decoder 29 includes a CMOS inverter 43, which includes a pMOS transistor 44 and an nMOS transistor 45. The pMOS transistor 44 has a source connected to the SVii power supply line 36, a gate connected to a node 46 at which the drain of the pMOS transistor 35 is connected to the drain of the nMOS transistor 41. The nMOS transistor 45 has a drain connected to the drain of the pMOS transistor 44, a gate connected to the node 46, and a source connected to the VBB power supply line 42.

The word decoder shown in FIG. 7 includes a second word decoder 47 serving as a quarter word decoder, which is configured as follows. A NAND circuit 48 decoders an internal row address signal ADD 2 for selecting the word line WL. A level converter circuit 49 converts the high-level output signal of the NAND circuit 48 into the boosted voltage SVii, and converts the low-level output signal thereto into the negative voltage VBB.

The level converter circuit 49 configured as follows. An nMOS transistor 50 is turned ON and OFF in response to the output signal of the NAND circuit 48. The source of the nMOS transistor 50 is grounded, and the gate thereof is connected to the NAND circuit 48.

A pMOS flip-flop circuit 51 is made up of pMOS transistors 52 and 53 respectively serving as pull-up elements. The pMOS transistor 52 has a source connected to the SVii power supply line 36, a gate connected to the drain of the PMOS transistor 53, and a drain connected to the drain of the nMOS transistor 50. The pMOS transistor 53 has a source connected to the SVii power supply line 36, and a gate connected to the drain of the pMOS transistor 52.

A pMOS transistor 54 is turned ON and OFF in response to the output signal of the NAND circuit 48. The source of the pMOS transistor 54 is connected to the Vii power supply line 38, and the gate thereof is connected to the output terminal of the NAND circuit 48.

An nMOS flip-flop circuit 55 is made up of nMOS transistors 56 and 57 serving as pull-down elements. The nMOS transistor 56 has a source connected to the VBB power supply line 42, a gate connected to the drain of the nMOS transistor 57, and a drain connected to the drain of the pMOS transistor 54. The nMOS transistor 57 has a source connected to the VBB power supply line 42, a gate connected to the drain of the nMOS transistor 56, and a drain connected to the drain of the pMOS transistor 53.

A CMOS inverter 58 is made up of a pMOS transistor 59 and an nMOS transistor 60. The pMOS transistor 59 has a source connected to the SVii power supply line 36, and a gate connected to a node 61 at which the drain of the pMOS transistor 53 is connected to the drain of the nMOS transistor 57. The nMOS transistor 60 has a drain connected to the drain of the pMOS transistor 59, a gate connected to t he node 61, and a source connected to the VBB power supply line 42.

A CMOS inverter 62 is made up of a pMOS transistor 63 and an nMOS transistor 64. The PMOS transistor 63 has a source connected to the SVii power supply line 36, and a gate connected to the output terminal of the CMOS inverter 58. The nMOS transistor 64 has a drain connected to the drain of the pMOS transistor 63, a gate connected to the output terminal of the CMOS inverter 58, and a source connected to the VBB power supply line 42.

A CMOS inverter 65 is made up of a pMOS transistor 66 and an nMOS transistor 67. The pMOS transistor 66 has a source connected to the SVii power supply line 36, and a gate connected to the output terminal of the CMOS inverter 62. The nMOS transistor 67 has a drain connected to the drain of the pMOS transistor 66, a gate connected to the output terminal of the CMOS inverter 62, and a source connected to the VBB power supply line 42.

The word decoder shown in FIG. 7 includes a third word decoder 68 serving as a sub word decoder. The sub word decoder 68 includes a pMOS transistor 69, and nMOS transistors 70 and 71. The pMOS transistor 69 has a source connected to the output terminal of the CMOS inverter 43, a gate connected to the output terminal of the CMOS inverter 62, and a drain connected to the word line WL. The nMOS transistor 70 has a drain connected to the output terminal of the CMOS inverter 43, a gate connected to the output terminal of the CMOS inverter 65, and a source connected to the word line WL. The nMOS transistor 71 has a drain connected to the word line WL, a gate connected to the output terminal of the CMOS inverter 62, and a source connected to the VBB power supply line 42.

The word line WL is not selected in the following three cases. In the first case, the main word decoder 29 is not selected, and the quarter word decoder 47 is not selected. In the second case, the main word decoder 29 is selected, and the quarter word decoder 47 is not selected. In the third case, the main word decoder 29 is not selected, and the quarter word decoder 47 is selected.

In the first case, the output signal of the NAND circuit 30 of the main word decoder 29 is equal to Vii, and the MOS transistors 32 and 37 are respectively ON and OFF. Hence, the MOS transistors 35, 34, 40 and 41 are respectively ON, OFF, ON and OFF. Further, the voltage of the node 46 is equal to SVii. In the CMOS inverter 43, the MOS transistors 44 and 45 are respectively OFF and ON, and thus the output signal of the CMOS inverter 43 is equal to VBB.

In the quarter word decoder 47, the output signal of the NAND circuit 48 is equal to Vii, and the MOS transistors 50 and 54 are respectively ON and OFF. Hence, the MOS transistors 53, 52, 56 and 57 are respectively ON, OFF, ON and OFF. The voltage of the node 61 is equal to SVii. In the CMOS inverter 58, the MOS transistors 59 and 60 are respectively OFF and ON, and thus the output voltage of the CMOS inverter 58 is equal to VBB.

Hence, in the CMOS inverter 62, the MOS transistors 63 and 64 are respectively ON and OFF, and the output signal of the CMOS inverter 62 is equal to SVii. In the CMOS inverter 65, the MOS transistors 66 and 67 are OFF and ON, respectively, and the output of the CMOS inverter 65 is equal to VBB.

Hence, in the sub word decoder 68, the MOS transistors 69 and 70 are both OFF, and the nMOS transistor 71 is ON. Thus, the voltage of the word line WL is equal to VBB.

In the above-mentioned second case where the main word decoder 29 is selected and the quarter word decoder 47 is not selected, the output signal of the NAND circuit 30 of the main word decoder 29 is equal to VSS, and the MOS transistors 32 and 37 are respectively OFF and ON. Hence, the MOS transistors 41, 40, 34 and 35 are respectively ON, OFF, ON, OFF. The voltage of the node 46 is equal to VBB. In the CMOS inverter 43, the MOS transistors 44 and 45 are respectively ON and OFF, and the output voltage of the CMOS inverter 43 is equal to SVii.

In the quarter word decoder 47, the output voltage of the NAND circuit 48 is equal to Vii, and the MOS transistors 50 and 54 are respectively ON and OFF. Hence, the MOS transistors 53, 52, 56 and 57 are respectively ON, OFF, ON and OFF. The voltage of the node 61 is equal to SVii. In the CMOS inverter 58, the MOS transistors 59 and 60 are respectively OFF and ON, and the voltage of the CMOS inverter 58 is equal to VBB.

Hence, in the CMOS inverter 62, the MOS transistors 63 and 64 are respectively ON and OFF, and the output voltage of the CMOS inverter 62 is equal to SVii. In the CMOS inverter 65, the MOS transistors 66 and 67 are respectively OFF and ON, and the output of the CMOS inverter 65 is equal to VBB.

Hence, in the sub word decoder 68, the MOS transistors 69, 70 and 71 are respectively OFF, OFF and ON, and the voltage of the word line WL is equal to VBB.

In the third case where the main word decoder 29 is not selected and the quarter word decoder 47 is selected, the output signal of the NAND circuit 30 of the main word decoder 29 is equal to Vii, and the MOS transistors 32 and 37 are respectively ON and OFF. Hence, the MOS transistors 35, 34, 40 and 41 are respectively ON, OFF, ON and OFF. The voltage of the node 46 is equal to SVii. In the CMOS inverter 43, the MOS transistors 44 and 45 are OFF and ON, and the output voltage of the CMOS inverter 43 is equal to VBB.

In the quarter word decoder 47, the output voltage of the NAND circuit 48 is equal to VSS, and the MOS transistors 50 and 54 are respectively OFF and ON. Hence, the MOS transistors 57, 56, 52 and 53 are respectively ON, OFF, ON and OFF. The voltage of the node 61 is equal to VBB. In the CMOS inverter 58, the MOS transistors 59 and 60 are respectively ON and OFF, and the output voltage of the CMOS inverter 58 is equal to SVii.

Hence, in the CMOS inverter 62, the MOS transistors 63 and 64 are respectively OFF and ON, and the output voltage of the CMOS inverter 62 is equal to VBB. In the CMOS inverter 65, the MOS transistors 66 and 67 are ON and OFF, and the output voltage of the CMOS inverter 65 is equal to SVii.

Hence, in the sub word decoder 68, the MOS transistors 69, 70 and 71 are respectively ON, ON and OFF, and the voltage of the word line WL is equal to VBB.

When the word line WL is selected, the output voltage of the NAND circuit 30 of the main word decoder 29 is equal to VSS, and the MOS transistors 32 and 37 are respectively OFF and ON. Hence, the MOS transistors 41, 40, 34 and 35 are respectively ON, OFF, ON and OFF. The voltage of the node 46 is equal to VBB. In the CMOS inverter 43, the MOS transistors 44 and 45 are respectively ON and OFF, and the output voltage of the CMOS inverter 43 is equal to SVii.

In the quarter word decoder 47, the output voltage of the NAND circuit 48 is equal to VSS, and the MOS transistors 50 and 54 are respectively OFF and ON. Hence, the MOS transistors 57, 56, 52 and 53 are respectively turned ON, OFF, ON and OFF. The voltage of the node 61 is equal to VBB. In the CMOS inverter 58, the MOS transistors 59 and 60 are respectively ON and OFF, and the output voltage of the CMOS inverter 58 is equal to SVii.

Hence, in the CMOS inverter 62, the MOS transistors 63 and 64 are respectively OFF and ON, and the output voltage of the CMOS inverter 62 is equal to VBB. In the CMOS inverter 65, the MOS transistors 66 and 67 are respectively ON and OFF, and the output voltage of the CMOS inverter 65 is equal to SVii.

Hence, in the sub word decoder 68, the MOS transistors 69, 70 and 71 are respectively ON, ON and OFF, and the voltage of the word line WL is equal to SVii.

According to the first embodiment of the present invention, the voltage of the word line WL can be set equal to the negative voltage VBB when the word line WL is not selected. Hence, even when the voltage of the storage node 14 of the memory cell 11 is equal to Vii, the leakage current flowing from the cell transistor 12 can be reduced.

Further, according to the first embodiment of the present invention, the dummy capacitor 17 is arranged so as to have a capacitance value which ensures the accurate sense operation of the sense amplifier 22 and which makes it possible for the bit line /BL to have a voltage lower than half the voltage appearing on the bit line BL when high-level data is output to the bit line BL from the memory cell 11 in a case where no leakage current flows from the cell transistor 12. Hence, it is possible to obtain almost the same operational margin of the sense amplifier 22 with respect to the high-level data output to the bit line BL as that with respect to the low-level data output to the bit line BL.

In the first embodiment of the present invention, the voltage of the dummy word line DWL to be set when not selected is the negative voltage VBB. Alternatively, the voltage of the dummy word line DWL to be set when not selected is the ground voltage VSS taking into account a leakage from the dummy cell 15. Hence, the current consumed in a negative voltage generating circuit (not shown) can be reduced.

A description will now be given, with reference to FIGS. 8 and 9, of a second embodiment of the present invention.

Figure 8:
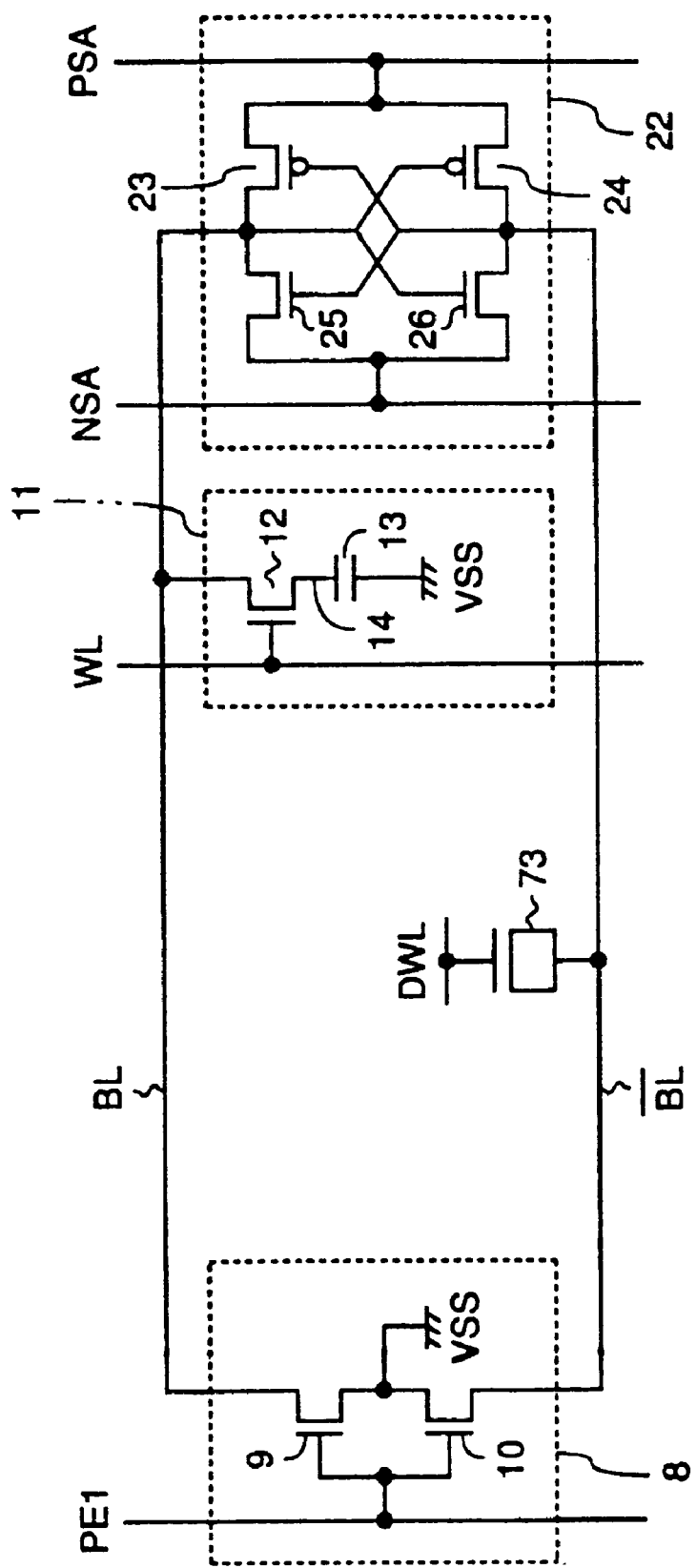
FIG. 8 is a circuit diagram of one column of a semiconductor memory device according to a second embodiment of the present invention.

FIG. 8 is a circuit diagram of one column of a semiconductor memory device according to the second embodiment of the present invention, which has a MOS capacitor 73 is substituted for the dummy cell 15 and the dummy cell capacitor precharge circuit 18 used in the first embodiment of the present invention. The other portions of the column shown in FIG. 8 is the same as that of the first embodiment of the present invention.

The gate of the MOS capacitor 73 is connected to the dummy word line DWL, and the drain and source thereof are connected together and are further connected to the bit line /BL. The voltage of the dummy word line DWL is set to the boosted voltage when the dummy word line DWL is selected, and is set to the ground voltage VSS when not selected.

The MOS capacitor 73 is arranged so as to have a capacitance value which ensures the accurate sense operation of the sense amplifier 22 and which makes it possible for the bit line /BL to have a voltage lower than half the voltage appearing on the bit line BL when high-level data is output to the bit line BL from the memory cell 11 in a case where no leakage current flows from the cell transistor 12.

Figure 9:
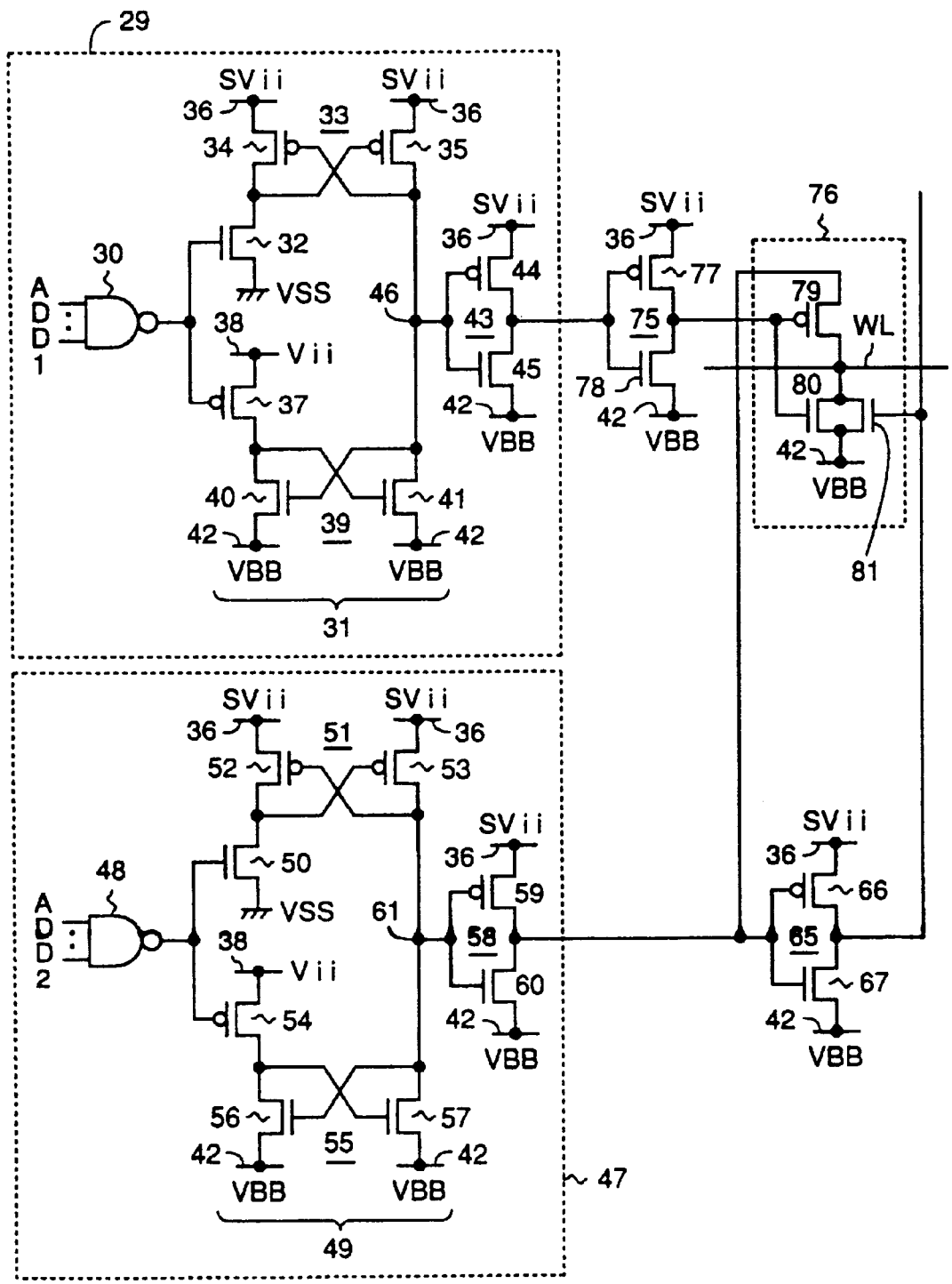
FIG. 9 is a circuit diagram of a word decoder of the semiconductor memory device according to the second embodiment of the present invention.

FIG. 9 is a circuit diagram of a part of a word decoder provided in the semiconductor memory device according to the second embodiment of the present invention. The CMOS inverter 62 and the sub word decoder 68 used in the first embodiment of the present invention are replaced by a CMOS inverter 75 and a sub word decoder 68, respectively. The other portions of the word decoder shown in FIG. 9 are the same as those of that used in the first embodiment of the present invention.

The CMOS inverter 75 has a pMOS transistor 77 and an nMOS transistor 78. The pMOS transistor 77 has a source connected to the SVii power supply line 36, and a gate connected to the output terminal of the CMOS inverter 43. The nMOS transistor 78 has a drain connected to the drain of the pMOS transistor 77, a gate connected to the output terminal of the CMOS inverter 43, and a source connected to the VBB power supply line 42.

The sub word decoder 76 has a pMOS transistor 79, and nMOS transistors 80 and 81. The pMOS transistor 79 has a source connected to the output terminal of the CMOS inverter 58, a gate connected to the output terminal of the CMOS inverter 75, and a drain connected to the word line WL. The nMOS transistor 80 has a drain connected to the word line WL, a gate connected to the output terminal of the CMOS inverter 75, and a source connected to the VBB power supply line 42. The nMOS transistor 81 has a drain connected to the word line WL, a gate connected to the output terminal of the CMOS terminal 65, and a source connected to the VBB power supply line 42.

The word line WL is not selected in the following three cases. In the first case, the main word decoder 29 is not selected, and the quarter word decoder 47 is not selected. In the second case, the main word decoder 29 is selected, and the quarter word decoder 47 is not selected. In the third case, the main word decoder 29 is not selected, and the quarter word decoder 47 is selected.

In the first case, the output voltage of the NAND circuit 30 of the main word decoder 29 is equal to Vii, and the MOS transistors 32 and 37 are ON and OFF, respectively. Hence, the MOS transistors 35, 34, 40 and 41 are respectively ON, OFF, ON and OFF, and the voltage of the node 46 is equal to SVii. In the CMOS inverter 43, the MOS transistors 44 and 45 are respectively OFF and ON, and the output voltage of the CMOS inverter 43 is equal to VBB. Hence, in the CMOS inverter 75, the MOS transistors 77 and 78 are respectively ON and OFF, and the output signal of the CMOS inverter 75 is equal to SVii.

In the quarter word decoder 47, the output voltage of the NAND circuit 48 is equal to Vii, and the MOS transistors 50 and 54 are respectively ON and OFF. Hence, the MOS transistors 53, 52, 56 and 57 are respectively ON, OFF, ON and OFF, and the voltage of the node 61 is equal to SVii. In the CMOS inverter 58, the MOS transistors 59 and 60 are OFF and ON, respectively, and the output voltage of the CMOS inverter 58 is equal to VBB. Hence, in the CMOS inverter 65, the MOS transistors 66 and 67 are respectively ON and OFF, and the output voltage of the CMOS inverter 65 is equal to SVii.

Hence, in the sub word decoder 76, the MOS transistors 79, 80 and 81 are respectively OFF, ON and ON, and the voltage of the word line WL is equal to VBB.

In the second case where the main word decoder 29 is selected and the quarter word decoder 47 is not selected, the output voltage of the NAND circuit 30 of the main word decoder 29 is equal to VSS, and the MOS transistors 32 and 37 are OFF and ON, respectively. Hence, the MOS transistors 41, 40, 34 and 35 are respectively ON, OFF, ON and OFF, and the voltage of the node 46 is equal to VBB. In the CMOS inverter 43, the MOS transistors 44 and 45 are ON and OFF, and the output voltage of the CMOS inverter 43 is equal to SVii.

Hence, in the CMOS inverter 75, the MOS transistors 77 and 78 are respectively OFF and ON, and the output voltage of the CMOS inverter 75 is equal to VBB.

In the quarter word decoder 47, the output voltage of the NAND circuit 48 is equal to Vii, and the MOS transistors 50 and 54 are respectively ON and OFF. Hence, the MOS transistors 53, 52, 56 and 57 are respectively ON, OFF, ON and OFF, and the voltage of the node 61 is equal to SVii. In the CMOS inverter 58, the MOS transistors 59 and 60 are respectively OFF and ON, and the output voltage of the CMOS inverter 58 is equal to VBB. Hence, in the CMOS inverter 65, the MOS transistors 66 and 67 are respectively ON and OFF, and the output voltage of the CMOS inverter 65 is equal to SVii.

Hence, in the sub word decoder 76, the MOS transistors 79, 80 and 81 are respectively ON, OFF and ON, and the voltage of the word line WL is equal to VBB.

In the third case where the main word decoder 29 is not selected and the quarter word decoder 47 is selected, the output voltage of the main word decoder 29 is equal to Vii, and the MOS transistors 32 and 37 are respectively ON and OFF. Hence, the MOS transistors 35, 34, 40 and 41 are respectively ON, OFF, ON and OFF, and the voltage of the node 46 is equal to SVii. In the CMOS inverter 43, the MOS transistors 44 and 45 are respectively OFF and ON, and the output voltage of the CMOS inverter 43 is equal to VBB.

Hence, in the CMOS inverter 75, the MOS transistors 77 and 78 are respectively ON and OFF, and the output voltage of the CMOS inverter 75 is equal to SVii.

In the quarter word decoder 47, the output voltage of the NAND circuit 48 is equal to VSS, and the MOS transistors 50 and 54 are respectively OFF and ON. Hence, the MOS transistors 57, 56, 52 and 53 are respectively ON, OFF, ON and OFF, and the voltage of the node 61 is equal to VBB. In the CMOS inverter 58, the MOS transistors 59 and 60 are respectively ON and OFF, and the output voltage of the CMOS inverter 58 is equal to SVii.

Hence, in the CMOS inverter 65, the MOS transistors 66 and 67 are respectively OFF and ON, and the output voltage of the CMOS inverter 65 is equal to VBB. Hence, in the sub word decoder 76, the MOS transistors 79, 80 and 81 are respectively OFF, ON and OFF, and the voltage of the word line WL is equal to VBB.

When the word line WL is selected, the output voltage of the NAND circuit 30 of the main word decoder 29 is equal to VSS, and the MOS transistors 32 and 37 are respectively OFF and ON. Hence, the MOS transistors 41, 40, 34 and 35 are respectively ON, OFF, ON and OFF, and the voltage of the node 46 is equal to VBB. In the CMOS inverter 43, the MOS transistors 44 and 45 are respectively ON and OFF, and the output voltage of the CMOS inverter 43 is equal to SVii. Hence, in the CMOS inverter 75, the MOS transistors 77 and 78 are respectively OFF and ON, and the output voltage of the CMOS inverter 75 is equal to VBB.

In the quarter word decoder 47, the output of the NAND circuit 48 is equal to VSS, and the MOS transistors 50 and 54 are respectively OFF and ON. Hence, the MOS transistors 57, 56, 52 and 53 are respectively ON, OFF, ON and OFF, and the voltage of the node 61 is equal to VBB. In the CMOS inverter 58, the MOS transistors 59 and 60 are respectively ON and OFF, and the output voltage of the CMOS inverter 58 is equal to SVii. Hence, in the CMOS inverter 65, the MOS transistors 66 and 67 are respectively OFF and ON, and the output voltage of the CMOS inverter 65 is equal to VBB.

Hence, in the sub word decoder 76, the MOS transistors 79, 80 and 81 are respectively ON, OFF and OFF, and the voltage of the word line WL is equal to SVii.

According to the second embodiment of the present invention, when the word line WL is not selected, the voltage of the word line WL can be set to the negative voltage VBB. Hence, the leakage current flowing from the cell transistor 12 can be reduced even when the voltage of the storage node 14 of the memory cell 11 is equal to Vii.

According to the second embodiment of the present invention, the MOS capacitor 73 is arranged so as to have a capacitance value which ensures the accurate sense operation of the sense amplifier 22 and which makes it possible for the bit line /BL to have a voltage lower than half the voltage appearing on the bit line BL when high-level data is output to the bit line BL from the memory cell 11 in a case where no leakage current flows from the cell transistor 12. Hence, it is possible to obtain almost the same operational margin of the sense amplifier 22 with respect to the high-level data output to the bit line BL as that with respect to the low-level data output to the bit line BL.

Furthermore, the voltage of the dummy word line DWL to be set when not selected is equal to the ground voltage VSS. Hence, the current consumed in a negative voltage generating circuit (not shown) can be reduced.

A description will now be given of third and fourth embodiments of the present invention.

Figure 1:
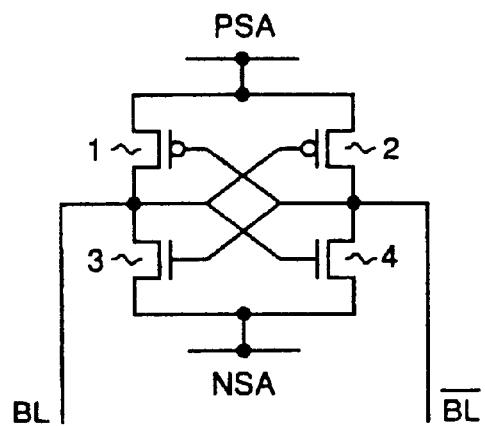
FIG. 1 is a circuit diagram of a sense amplifier provided in a DRAM device.
Figure 2:
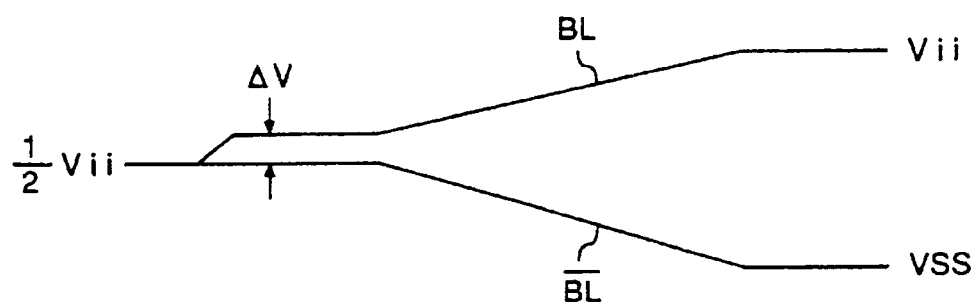
FIG. 2 is a waveform diagram of an operation of the sense amplifier shown in FIG. 1 and provided in a DRAM device employing a ½•Vii precharge method.
Figure 3:
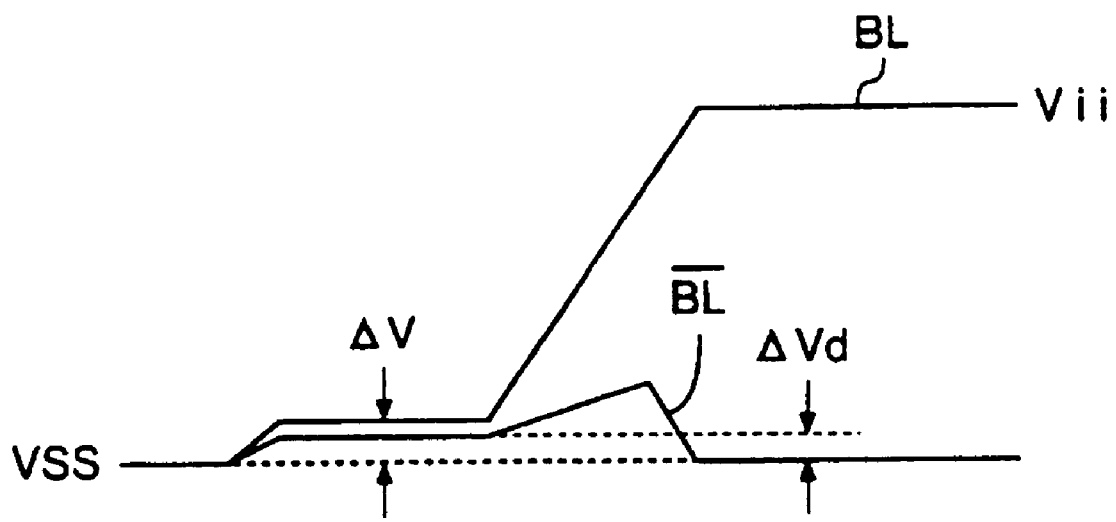
FIG. 3 is a waveform diagram of an operation of the sense amplifier shown in FIG. 1 and provided in a DRAM device employing a VSS precharge method.
Figure 4:
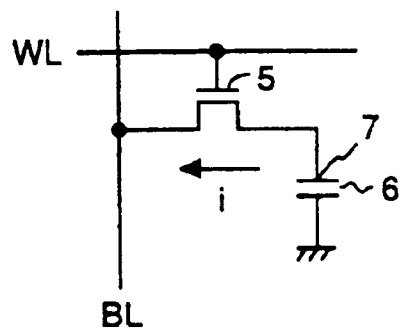
FIG. 4 is a circuit diagram of a memory cell provided in the general DRAM device.
Figure 5:
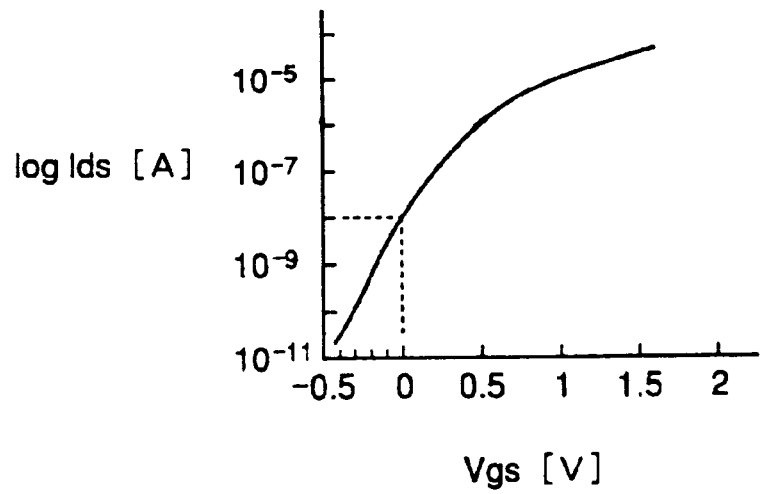
FIG. 5 is a graph of a drain-source current ids vs. gate-source voltage of a cell transistor shown in FIG. 4.
Figure 10:
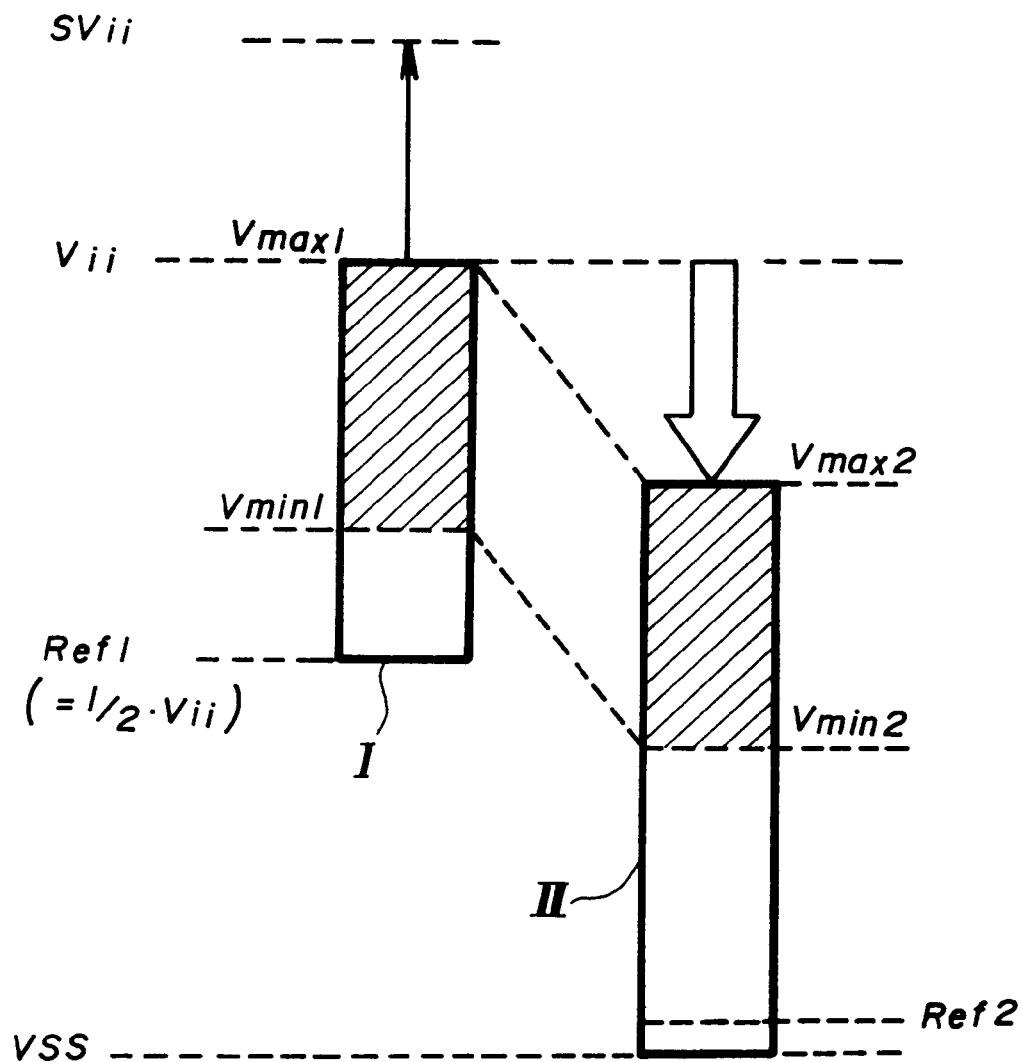
FIG. 10 is a graph showing the principle of third and fourth embodiments of the present invention.

FIG. 10 is a diagram showing the operational margins of the sense amplifier in the ½•Vii precharge method and the VSS precharge method. Blocks I and II relate to the ½•Vii precharge method and the VSS precharge method, respectively and indicate the potentials of the storage node 7 shown in FIG. 4. A reference voltage Ref1 is equal to half the internal power supply voltage Vii. The sense amplifier in the ½•Vii precharge method can accurately sense high-level data when the voltage of the storage node 7 falls within a potential range between an upper limit potential Vmax1 and a lower limit potential Vmin1. At this time, the boosted voltage SVii higher than the internal power supply voltage Vii is applied to the gate of the cell transistor 5, as has been described.

In the VSS precharge method, even if the charge stored in the memory cell is leaked, the potential of the storage node 7 will not greatly be changed when the memory cell stores low-level data. Hence, a reference voltage Ref2 of the sense amplifier with respect to low-level data in the VSS precharge method does not require a large margin. Thus, as shown in FIG. 10, the reference voltage Ref2 defined with respect to low-level data is set slightly higher than the ground voltage VSS. This makes it possible for the sense amplifier in the VSS precharge method to sense high-level data within a lower potential ranger defined by an upper limit potential Vmax2 and a lower limit potential Vmin2. The upper limit potential Vmax2 can be lower than the internal power supply voltage Vii. In this case, when the memory cell is selected, the potential of the word line WL is required to be higher than the upper limit potential Vmax2 by at least the threshold voltage VTH of the cell transistor 5. For example, the potential of the word wine WL can be equal to the internal power supply voltage Vii. In this case, the internal power supply voltage Vii can be higher than the sum of the upper limit voltage Vmax2 and the threshold voltage of the cell transistor 5. When the internal power supply voltage Vii is used to drive the cell transistor 5 which has a reduced threshold voltage in the line negative resetting formation, the boosted voltage SVii is not required. In this case, the high level of the bit lines can be equal to the internal power supply voltage Vii due to the VSS bit line precharging formation. Usually, there are provided transfer transistors provided in each pair of bit lines and connected to the sense amplifier. In the case where the high-level of the bit lines is equal to Vii, it is necessary to provide the gates of the transfer transistors with a voltage equal to the sum of Vii+Vth+α where Vth denotes the threshold voltage of the bit line transfer gates and α is a margin voltage. In the VSS bit line precharge formation, one of the bit lines is switched to the high level and the other bit line is switched to the low level. Hence, when the gates of the bit line transfer transistors are in a floating state before the sense amplifier starts operating, the gate voltage can be boosted due to a coupling with the bit lines. Hence, there is no need for the boost circuit which generates the boosted voltage SVii from the power supply voltage Vii. This contributes to reducing the power consumption. In addition, since the word line WL is set to the negative voltage VBB when not selected and the threshold voltage of the cell transistor can be reduced, the leakage current is suppressed as has been described previously.

It is also possible to use an external power supply voltage as the high level of the word lines when the internal power supply voltage is generated by stepping down the external power supply voltage within the semiconductor memory device. In this case, when the voltage of the bit lines changes between VSS (0 V) and Vii (1.3 V, for example), the word line is required to be set to the voltage equal to the sum of Vii+Vth+α where Vth is the threshold voltage of the cell transistor and a is a margin voltage. The threshold voltage Vth of the cell transistor can be reduced and the internal power supply voltage Vii can also be reduced. Hence, the external power supply voltage Vcc (2.5 V, for example) can be used as the high level of the word line. In other words, the bit line potential lower than Vii can be used. In this case, there is no need for a boosted voltage.

The third and fourth embodiments of the present invention do not use the boosted power supply voltage SVii to be applied to the word line but uses the internal power supply voltage Vii, and correspond to modifications of the first and second embodiments thereof, respectively.

Figure 11:
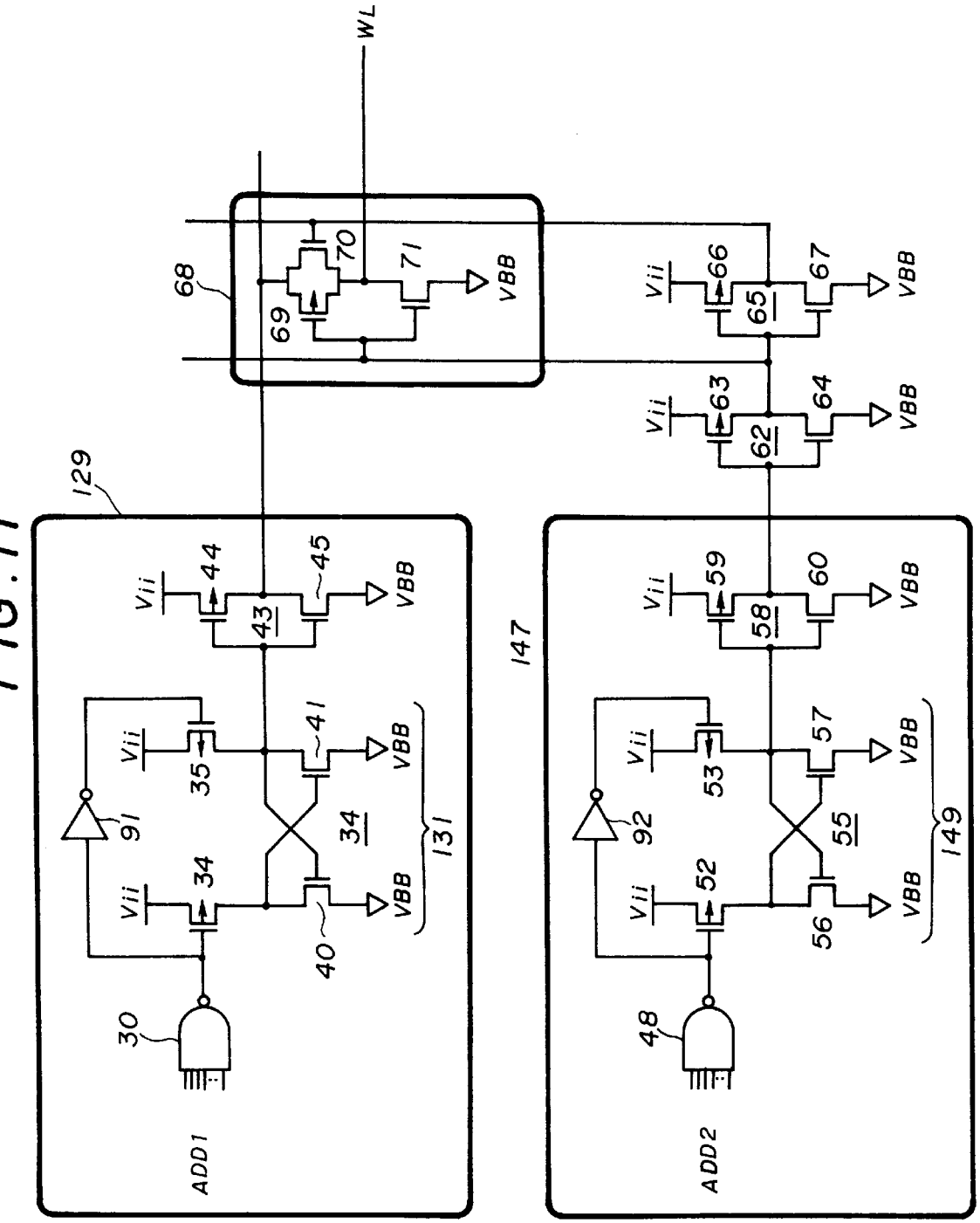
FIG. 11 is a circuit diagram of a word decoder of a semiconductor device according to the third embodiment of the present invention.

FIG. 11 is a circuit diagram of a word decoder used in the third embodiment of the present invention. In FIG. 11, parts that are the same as those shown in the previously described figures are given the same reference numbers. The word decoder shown in FIG. 11 is made up of a main word decoder 129, a quarter word decoder 147, and the sub word decoder 68. The main word decoder 129 is designed to receive the internal power supply voltage Vii. Similarly, the quarter word decoder 147 is designed to receive the internal power supply voltage Vii. Further, the CMOS inverters 62 and 65 operate with the internal power supply voltage Vii.

The main word decoder 129 does not have the pMOS flip-flop 33 shown in FIG. 7 but has the nMOS flip-flop 39 only. The pMOS transistors 34 and 35, which receive the internal power supply voltage Vii, are connected in series to the nMOS transistors 40 and 41, respectively. The gate of the pMOS transistor 34 is connected to the output terminal of the NAND circuit 30. An inverter 91 inverts the output signal of the NAND circuit 30, and applies the inverted voltage thereof to the gate of the pMOS transistor 35. Hence, either the pMOS transistor 34 or the pMOS transistor 35 is ON according to the output signal of the NAND circuit 30. The output signal of the nMOS flip-flop 39 is supplied to the sub word decoder 68 via the CMOS inverter 43.

The quarter word decoder 147 does not have the pMOS flip-flop 51 shown in FIG. 7 but has the nMOS flip-flop 55 only. The pMOS transistors 52 and 53, which receive the internal power supply voltage Vii, are connected in series to the nMOS transistors 56 and 57, respectively. The gate of the pMOS transistor 52 is connected to the output terminal of the NAND circuit 48. An inverter 92 inverts the output signal of the NAND circuit 30, and applies the inverted version thereof to the gate of the pMOS transistor 53. Hence, either the pMOS transistor 52 or the pMOS transistor 53 is ON according to the output signal of the NAND circuit 48. The output signal of the nMOS flip-flop 55 is supplied to the CMOS inverter 62 via the CMOS inverter 58.

Figure 12:
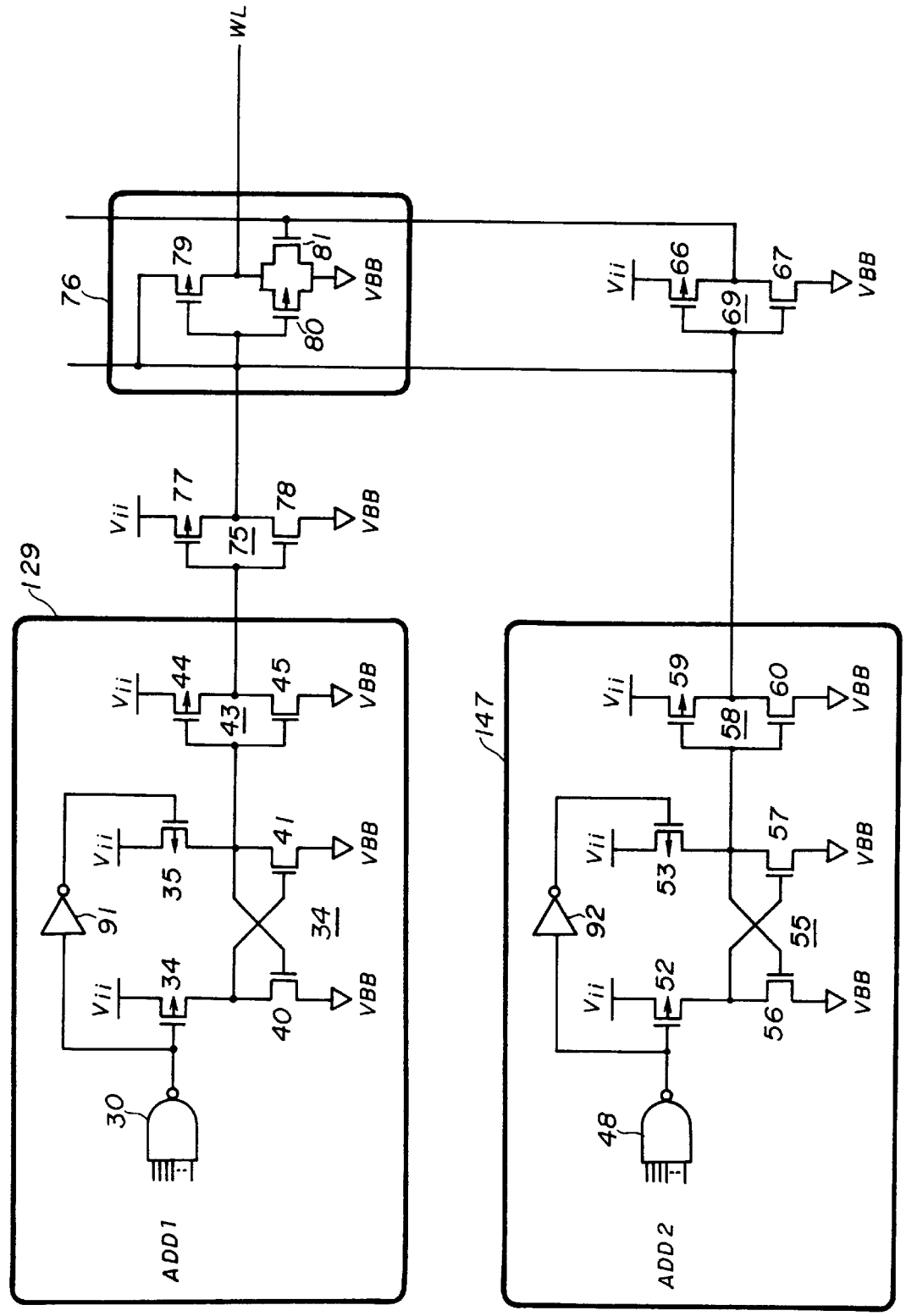
FIG. 12 is a circuit diagram of a word decoder of a semiconductor device according to the fourth embodiment of the present invention.

FIG. 12 is a circuit diagram of a word decoder used in the fourth embodiment of the present invention. In FIG. 12, parts that are the same as those shown in the previously described figures are given the same reference numbers. The word decoder shown in FIG. 12 is made up of the main word decoder 129, the quarter word decoder 147, the sub word decoder 76, and the CMOS inverters 65 and 75. The main word decoder 129 and the quarter word decoder 147 are designed to receive the internal power supply voltage Vii, as has been described previously. Further, the CMOS inverters 65 and 75 operate with the internal power supply voltage Vii.

The third and fourth embodiments of the present invention operate with the internal power supply voltage Vii and do not require the voltage boost circuit, so that the amount of energy consumed in the semiconductor memory device can be reduced.

The present invention is not limited to the specifically disclosed embodiments, and variations and modifications may be made without departing from the scope of the present invention.

What is claimed is:

1. A semiconductor memory device comprising:
a memory cell connected to a bit line and a word line;
a bit line precharge circuit which precharges the bit line to a ground voltage; and
a word decoder which sets the word line to a negative voltage when the word line is not selected.

2. The semiconductor memory device as claimed in claim 1, wherein the word decoder comprises a transistor circuit which decodes an address signal and applies a given voltage equal to or lower than an internal power supply voltage to the word line when a decoded address indicates the word line so that no boosted voltage produced from the internal power supply voltage is applied to the word line when the word line is selected.

3. The semiconductor memory device as claimed in claim 1, wherein said memory cell includes an N-channel transistor.

4. A semiconductor memory device comprising:
a pair of first and second bit lines;
a memory cell having a cell transistor and a cell capacitor, the cell transistor having a first current input/output electrode connected to the first bit line, a second input/output electrode connected to a first electrode of the cell capacitor having a second electrode grounded, and a control electrode connected to a word line;
a bit line precharge circuit which precharges the first and second bit lines to a ground voltage;
a reference voltage generating circuit which sets the second bit line to a reference voltage when data is read from the memory cell;
a sense amplifier which amplifies a potential difference between the first and second bit lines when data is read from the memory cell; and
a word decoder which sets the word line to a negative voltage when the word line is not selected.

5. The semiconductor memory device as claimed in claim 4, wherein the reference voltage generating circuit generates, on the second bit line, a voltage lower than half a voltage appearing on the first bit line when high-level data is output to the first bit line from the memory cell in a case where no leakage current flows from the cell transistor.

6. The semiconductor memory device as claimed in claim 4, wherein:
the reference voltage generating circuit comprises a dummy cell having a dummy cell transistor and a dummy cell capacitor; and
the dummy cell transistor has a first current input/output electrode connected to the second bit line, a control electrode connected to a dummy word line, and a second input/output electrode connected to a first electrode of the dummy cell capacitor having a second electrode grounded.

7. The semiconductor memory device as claimed in claim 6, wherein the dummy cell capacitor has a capacitance equal to or less than half that of the cell capacitor, so that the dummy word line can be set to a negative voltage when the dummy word line is not selected.

8. The semiconductor memory device as claimed in claim 6, wherein the dummy word line is set to the ground voltage when the dummy word line is not selected.

9. The semiconductor memory device as claimed in claim 7, further comprising a dummy cell capacitor precharge circuit which precharges the first electrode of the dummy cell capacitor when the first and second bit lines are precharged.

10. The semiconductor memory device as claimed in claim 4, wherein the reference voltage generating circuit comprises a capacitor having a first electrode connected to the second bit line and a second electrode connected to a dummy word line.

11. The semiconductor memory device as claimed in claim 10, wherein the capacitor is a MOS capacitor.

12. The semiconductor memory device as claimed in claim 10, wherein the dummy word line is set to a ground voltage when the dummy word line is not selected.

13. The semiconductor memory device as claimed in claim 4, wherein the word decoder comprises a transistor circuit which decodes an address signal and applies a boosted voltage to the word line when a decoded address indicates the word line, said boosted voltage being produced from an internal power supply voltage and higher than the internal power supply voltage.

14. The semiconductor memory device as claimed in claim 13, wherein the transistor circuit applies the negative voltage to the word line when the decoded address does not indicate the word line.

15. The semiconductor memory device as claimed in claim 4, wherein the word decoder comprises a transistor circuit which decodes an address signal and applies a given voltage equal to an internal power supply voltage to the word line when a decoded address indicates the word line so that no boosted voltage produced from the internal power supply voltage is applied to the word line when the word line is selected.

16. The semiconductor memory device as claimed in claim 15, wherein the transistor circuit applies the negative voltage to the word line when the decoded address does not indicate the word line.

17. The semiconductor memory device as claimed in claim 4, wherein the cell transistor is an N-channel transistor.

* * * * *